United States Patent
Kuroda et al.

(10) Patent No.: US 11,425,824 B2
(45) Date of Patent: Aug. 23, 2022

(54) METHOD FOR PRODUCING WIRING SUBSTRATE

(71) Applicant: TOYOTA JIDOSHA KABUSHIKI KAISHA, Toyota (JP)

(72) Inventors: Keiji Kuroda, Toyota (JP); Haruki Kondoh, Okazaki (JP); Kazuaki Okamoto, Toyota (JP); Rentaro Mori, Kasugai (JP); Hiroshi Yanagimoto, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/346,419

(22) Filed: Jun. 14, 2021

(65) Prior Publication Data
US 2021/0410291 A1 Dec. 30, 2021

(30) Foreign Application Priority Data
Jun. 25, 2020 (JP) .............................. JP2020-109734

(51) Int. Cl.
*C25D 5/02* (2006.01)
*H05K 3/10* (2006.01)
*H05K 3/18* (2006.01)
*C25D 7/00* (2006.01)
(Continued)

(52) U.S. Cl.
CPC .............. *H05K 3/108* (2013.01); *C25D 5/02* (2013.01); *C25D 5/34* (2013.01); *C25D 7/00* (2013.01); *H05K 3/18* (2013.01); *H05K 3/382* (2013.01); *H05K 2203/0723* (2013.01); *H05K 2203/1105* (2013.01)

(58) Field of Classification Search
None
See application file for complete search history.

(56) References Cited

U.S. PATENT DOCUMENTS

| 5,755,947 A | * | 5/1998 | McElhanon | ........... C25D 5/022 205/183 |
| 10,500,811 B1 | * | 12/2019 | Schaedler | ................. C22F 1/10 |
| 2016/0076162 A1 | | 3/2016 | Sato et al. | |

(Continued)

FOREIGN PATENT DOCUMENTS

| JP | 54068986 | * | 6/1979 | ............... C25D 5/48 |
| JP | 2014-185371 A | | 10/2014 | |

(Continued)

*Primary Examiner* — Stefanie S Wittenberg
(74) *Attorney, Agent, or Firm* — Sughrue Mion, PLLC

(57) ABSTRACT

A seeded substrate is first prepared. The seeded substrate includes an insulation substrate having a main surface composed of a first region and a second region other than the first region, and a conductive seed layer provided on the first region. Subsequently, a conductive layer is formed on at least the second region to obtain a first treated substrate. An insulation layer is then formed on the first treated substrate. The seed layer is then exposed. A metal layer is then formed on the surface of the seed layer. Here, a voltage is applied between the anode and the seed layer while a solid electrolyte membrane containing a metal ion-containing solution being disposed between the second treated substrate and the anode, and the solid electrolyte membrane and the seed layer being pressed into contact with each other. Thereafter, the insulation layer and the conductive layer are removed.

6 Claims, 10 Drawing Sheets

(51) Int. Cl.
*C25D 5/34* (2006.01)
*H05K 3/38* (2006.01)

(56) References Cited

U.S. PATENT DOCUMENTS

| | | | |
|---|---|---|---|
| 2016/0265129 A1* | 9/2016 | Hiraoka | C25D 17/005 |
| 2018/0366377 A1* | 12/2018 | Choi | H01L 23/291 |
| 2019/0148229 A1* | 5/2019 | Kubik | H05K 3/422 |
| | | | 257/774 |
| 2021/0084774 A1 | 3/2021 | Okamoto et al. | |

FOREIGN PATENT DOCUMENTS

| | | | |
|---|---|---|---|
| JP | 2021-48210 A | 3/2021 | |
| WO | WO-02098193 A1 * | 12/2002 | C23C 18/1607 |

* cited by examiner

METHOD FOR PRODUCING WIRING SUBSTRATE

CROSS REFERENCE TO RELATED APPLICATIONS

The present application claims priority from Japanese patent application JP 2020-109734 filed on Jun. 25, 2020, the content of which is hereby incorporated by reference into this application.

BACKGROUND

Technical Field

The present disclosure relates to a method for producing a wiring substrate.

Background Art

Conventionally, a plating method have been widely used to form a wiring in the production of a wiring substrate (i.e., a wiring board). However, the plating method requires rinsing with water after plating treatment, thereby requiring a processing of waste liquid. In order to overcome such drawback, JP 2014-185371 A discloses a method of forming a metal film including disposing a solid electrolyte membrane between an anode and a cathode (a substrate), providing a metal ion-containing solution between the anode and the solid electrolyte membrane, bringing the solid electrolyte membrane into contact with the substrate, and applying a voltage between the anode and the substrate to deposit the metal on the substrate surface.

SUMMARY

JP 2014-185371 A does not disclose a method of forming a metal coating having a predetermined pattern. Accordingly, the present disclosure provides a method for producing a wiring substrate provided with a wiring layer having a predetermined wiring pattern using a solid electrolyte membrane.

An aspect of the present disclosure provides a method for producing a wiring substrate including an insulation substrate and a wiring layer having a predetermined wiring pattern and provided on the insulation substrate, the method including the steps of:

(a) preparing a seeded substrate including:
   the insulation substrate having a main surface composed of a first region having a predetermined pattern corresponding to the wiring pattern and a second region other than the first region; and
   a conductive seed layer provided on the first region;

(b) forming a conductive layer at least on the second region to obtain a first treated substrate;

(c) forming an insulation layer on the first treated substrate to coat the seed layer and the conductive layer with the insulation layer;

(d) exposing the seed layer by etching the insulation layer while leaving the insulation layer on the conductive layer on the second region to obtain a second treated substrate;

(e) forming a metal layer on the surface of the seed layer wherein a voltage is applied between the anode and the seed layer while a solid electrolyte membrane containing a metal ion-containing solution being disposed between the second treated substrate and the anode, and the solid electrolyte membrane and the seed layer being pressed into contact with each other; and (f) removing the insulation layer and the conductive layer.

According to the method for production of the present disclosure, the wiring substrate provided with the wiring layer having the predetermined wiring pattern can be produced with the use of the solid electrolyte membrane.

DETAILED DESCRIPTION

Figure 1:
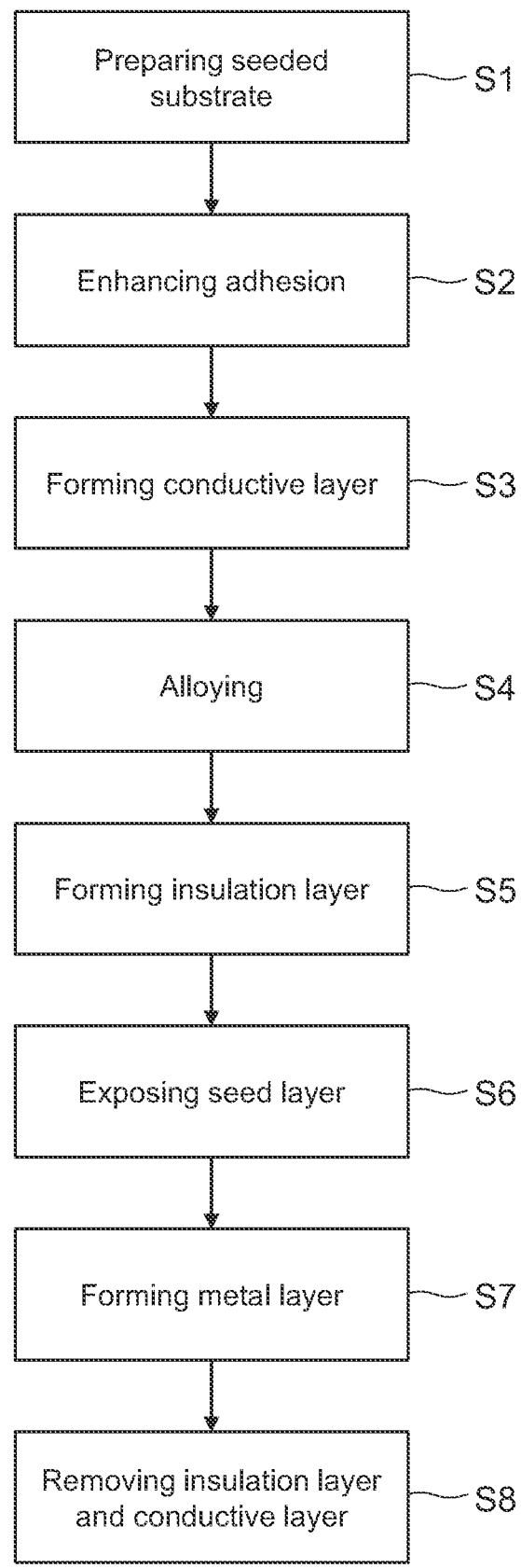
FIG. 1 is a flowchart showing a method for producing a wiring substrate according to an embodiment.

Hereafter, the embodiments of the present disclosure are described with reference to the drawings. In the drawings referred to in the following description, the same reference numerals are used for the same members or members having similar functions, and their repeated descriptions may be omitted in some cases. For the convenience of description, the dimensional ratio in the drawings may be different from the actual ratio in some cases, and some members may be omitted from the drawings in some cases. In the present disclosure, the numerical range including the preposition "to" encompasses numerical values before and after the preposition "to" as the lower limit and the upper limit, respectively.

As shown in FIG. 1, a method for producing a wiring substrate according to an embodiment includes: a step of preparing a seeded substrate (S1); a step of enhancing adhesion between an insulation substrate and a seed layer (S2); a step of forming a conductive layer (S3); a step of alloying a metal constituting the seed layer with a metal constituting the conductive layer (S4); a step of forming an insulation layer (S5); a step of exposing the seed layer (S6); a step of forming a metal layer (S7); and a step of removing the insulation layer and the conductive layer (S8). Step (S2) and Step (S4) are not indispensable. These steps are described below.

(1) Step of Preparing Seeded Substrate (S1)

Figure 2:
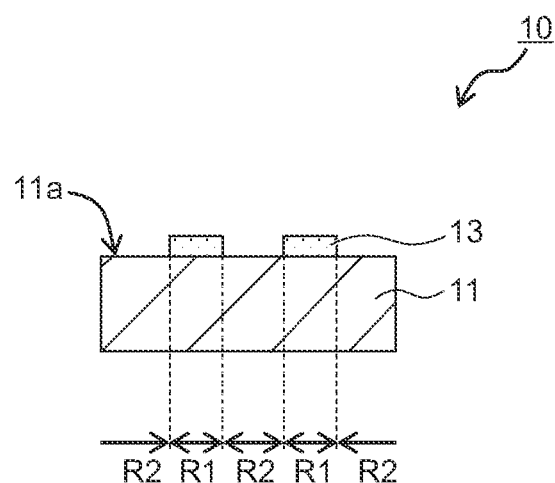
FIG. 2 is a drawing schematically illustrating a step of forming a seed layer.

At first, as shown in FIG. 2, the seed layer 13 is formed on a first region R1 of a main surface 11a of the insulation substrate 11 to obtain the seeded substrate 10. The first region R1 has a predetermined pattern corresponding to a wiring pattern of the wiring substrate produced by the production method according to the present embodiment. The main surface 11a of the insulation substrate 11 is composed of the first region R1 and a second region R2, which is a region other than the first region R1.

The insulation substrate 11 may be, for example, a resin substrate, a glass substrate, or a substrate including a resin and glass, such as a glass epoxy resin substrate. Examples of resin used for the insulation substrate 11 include: thermoplastic resin such as PET resin, PI (polyimide) resin, LCP (liquid crystal polymer), epoxy resin, ABS resin, AS resin, AAS resin, PS resin, EVA resin, PMMA resin, PBT resin, PPS resin, PA resin, POM resin, PC resin, PP resin, PE resin, polymer alloy resin including an elastomer and PP, modified PPO resin, PTFE resin, and ETFE resin; thermosetting resin such as phenolic resin, melamine resin, amino resin, unsaturated polyester resin, polyurethane, diallyl phthalate, silicone resin, and alkyd resin; and resin including epoxy resin mixed with cyanate resin.

A material constituting the seed layer 13 is not particularly limited, provided that the material is a conductive material. The material constituting the seed layer 13 may be Cu, Ag, or a Cu—Ag alloy. From the viewpoint of in-plane uniformity of the metal layer 14 described later, the seed layer 13 may have a thickness of 20 nm or more. In some embodiments, the seed layer 13 may have a thickness of 1,000 μm or more. From the viewpoint of production cost, the seed layer 13 may have a thickness of 1 μm or less. In some embodiments, the seed layer 13 may have a thickness of 300 nm or less.

The seed layer 13 may be formed by any method. For example, the seed layer 13 can be formed by applying a dispersion of metal particles containing Cu, Ag, or a Cu—Ag alloy to the first region R1 and solidifying the dispersion. In order to form finer wirings, each of the metal particles may have a smaller diameter. For example, each of the metal particles may have a diameter of 1 nm to 100 nm. Each of the metal particles may also have a diameter of 20 nm or less. The metal particles having such diameters have lower melting points, which facilitates sintering of the metal particles. A dispersion medium for the dispersion may be, for example, a liquid volatilizable by heating, such as decanol. The dispersion may contain an additive. Examples of the additive include straight-chain fatty acid salts having 10 to 17 carbon atoms. Examples of methods of applicating the dispersion include printing methods such as screen printing, inkjet printing, and transfer printing. A method of solidifying the dispersion is not particularly limited. For example, heating may be applied to volatilize the dispersion medium and sinter the metal particles, thereby solidifying the dispersion.

It is also allowable to dispose a metal mask on the insulation substrate 11 and then form the seed layer 13 in the first region R1 by vacuum deposition, sputtering, or the like.

Before forming the seed layer 13, the main surface 11a of the insulation substrate 11 may be subjected to surface treatment for better adhesion between the seed layer 13 and the insulation substrate 11. For example, a primer layer may be formed on the main surface 11a of the insulation substrate 11. Polyimide, polyamide imide, or the like can be used as a primer. Alternatively, the main surface 11a of the insulation substrate 11 may be roughened. Roughening can be performed by laser irradiation, etching, desmearing, mechanical processing (polishing or grinding), or other means.

The first region R1 may consist of a single continuous region or it may include a plurality of independent regions. When the first region R1 includes a plurality of independent regions, the seed layers 13 formed on respective independent regions are electrically connected to each other by the conductive layer 12. Thus, it is not necessary to provide the seed layer 13 on each independent region with a lead wiring, which would otherwise need to be used in the step of forming the metal layer (S7) described later.

(2) Step of Enhancing Adhesion (S2)

Subsequently, the adhesion between the insulation substrate 11 and the seed layer 13 is enhanced. For example, the seeded substrate 10 may be heated in an inert atmosphere to enhance the adhesion. The heating may be performed with the insulation substrate 11 and/or the seed layer 13 being pressed, which allows further enhancement of the adhesion. Step (S2) may be performed at any timing, provided that it is after the step of preparing the seeded substrate (S1) and before the step of forming the metal layer (S7). When Step (S2) is performed before the step of forming the conductive layer (S3), the seeded substrate 10 can be heated to a temperature equal to or higher than the heat-resistant temperature of the conductive layer 12 described later. Specifically, a low melting point material such as Sn can be used as a material constituting the conductive layer 12. Step (S2) is not indispensable.

The enhanced adhesion between the insulation substrate 11 and the seed layer 13 allows prevention or reduction of peeling of the seed layer 13 from the insulation substrate 11 when, for example, a solid electrolyte membrane 52 is separated from the metal layer 14 in the step of forming the metal layer (S7). In addition, the enhanced adhesion between the insulation substrate 11 and the seed layer 13 also leads to the improved adhesion between the wiring layer 2 and the insulation substrate 11 of the wiring substrate 1 (see FIG. 8) produced by the production method according to the embodiment.

(3) Step of Forming Conductive Layer (S3)

Figure 3:
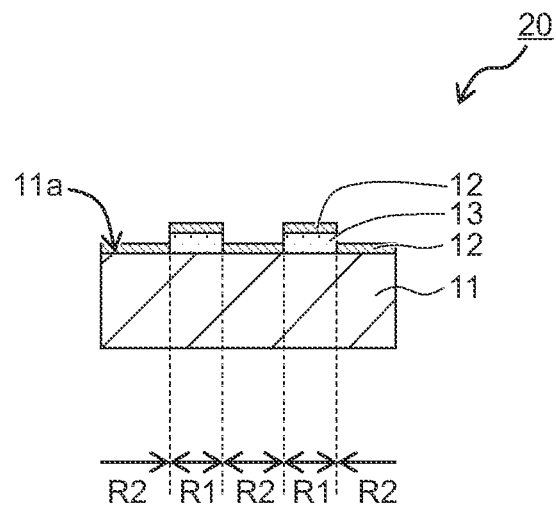
FIG. 3 is a drawing schematically illustrating a step of forming a conductive layer.

As shown in FIG. 3, the conductive layer 12 is formed on the seeded substrate 10 to obtain a first treated substrate 20. The conductive layer 12 is formed at least on the second region R2 on the main surface 11a of the insulation substrate 11. As shown in FIG. 3, the conductive layer 12 may be formed on the seed layer 13, as well as on the second region R2. When the conductive layer 12 is formed on the second region R2 and on the seed layer 13, a patterning technique is not necessary. This can simplify the production process.

The conductive layer 12 has sufficient conductivity for the formation the metal layer 14 described later. Examples of materials that can constitute the conductive layer 12 include metal silicides, such as $FeSi_2$, $CoSi_2$, $MoSi_2$, $WSi_2$, $VSi_2$, $ReSi_{1.75}$, $CrSi_2$, $NbSi_2$, $TaSi_2$, $TiSi_2$, and $ZrSi_2$, in particular, transition metal silicides; conductive metal oxides, such as $TiO_2$, SnO, GeO, and ITO (indium tin oxide); metals, such as Pd, Sn, Cu, Ti, Al, and Cr; an alloy containing at least one of Pd, Sn, Cu, Ti, Al, Cr, or Si; and conductive resin. In particular, the conductive layer 12 may contain a metal having a standard oxidation-reduction potential lower than that of the metal contained in the seed layer 13. This allows facilitating the etching of the conductive layer 12 in the step of exposing the seed layer (S6) and the step of removing the insulation layer and the conductive layer (S8) described later. When the seed layer 13 contains Ag, the conductive layer 12 may contain Pd, Sn, or Cu, or an alloy thereof. This allows alloying of the metal contained in the seed layer 13 with the metal contained in the conductive layer 12 in the step of alloying described later (S4) since Pd, Sn, and Cu can be alloyed with Ag.

The conductive layer 12 may have a natural oxide film on its surface. The term "natural oxide film" refers to an oxide film that is naturally formed on the surface of a substance when such substance is left to stand in the air. Examples of natural oxide films include a passive film formed on the surface of Ti, Al, Cr, or an alloy containing at least one of Ti, Al, or Cr, and $SiO_2$ formed on the surface of Si or silicide. The conductive layer 12 may have a thickness smaller than that of the seed layer 13. From the viewpoint of in-plane uniformity of the metal layer 14 described later, the conductive layer 12 may have a thickness of 20 nm or more. In some embodiments, the conductive layer 12 may have a thickness of 100 μm or more. From the viewpoint of production cost, the conductive layer 12 may have a thickness of 300 nm or less.

The conductive layer 12 may be formed by any method. For example, the conductive layer 12 can be formed by PVD (physical vapor deposition) such as sputtering, CVD (chemical vapor deposition), or electroless plating.

(4) Step of Alloying (S4)

When the seed layer 13 contains Ag and the conductive layer 12 contains Pd, Sn, Cu, or an alloy thereof, the metal contained in the seed layer 13 may be alloyed with the metal contained in the conductive layer 12. This allows avoiding or reducing migration of Ag contained in the seed layer 13. Alloying can be performed by heating the first treated substrate 20. Examples of heating means that may be employed include a reflow oven, an infrared ray lamp, a laser, and a xenon lamp. Step (S4) may be performed at any timing, provided that it is after the step of forming the conductive layer (S3) and before the step of forming the metal layer (S7). Step (S4) is not indispensable.

(5) Step of Forming Insulation Layer (S5)

Figure 4:
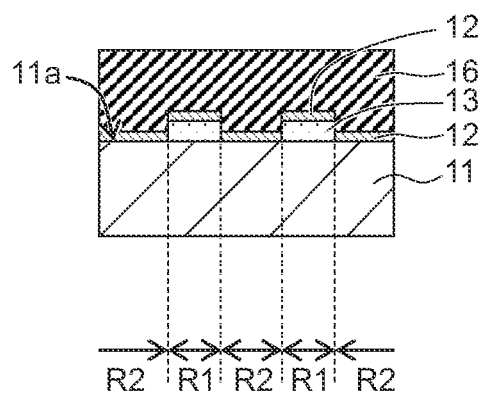
FIG. 4 is a drawing schematically illustrating a step of forming an insulation layer.

As shown in FIG. 4, the insulation layer 16 is formed on the first treated substrate 20, and the seed layer 13 and the conductive layer 12 are coated with the insulation layer 16.

A material constituting the insulation layer 16 is not particularly limited, provided that the material is an insulating material. Examples of materials that can constitute the insulation layer 16 include oxides, such as $SiO_2$, $Al_2O_3$, $TiO_2$, and SiOC (a carbon-doped silicon oxide), polysilane, polysilazane, epoxy resin, and acrylate resin.

The insulation layer 16 can be formed by any method, such as CVD, sputtering, mist coating, spin coating, or dip coating. Mist coating is a method including atomizing a raw material solution containing a metal element with the use of an ultrasonic transducer to form mist, supplying the mist to the substrate, and decomposing and/or reacting the mist on a substrate surface with thermal energy or the like, thereby forming a thin film containing the metal element on the substrate surface.

The insulation layer 16 may have a thickness equal to or larger than that of the seed layer 13. In particular, the thickness of the insulation layer 16 may be larger than that of the seed layer 13 by 2.5 to 10 times. This allows the surface of the insulation layer 16 to be sufficiently flat, which facilitates forming a second treated substrate 30 with a flat surface in the subsequent step of exposing the seed layer (S6).

(6) Step of Exposing Seed Layer (S6)

Figure 5:
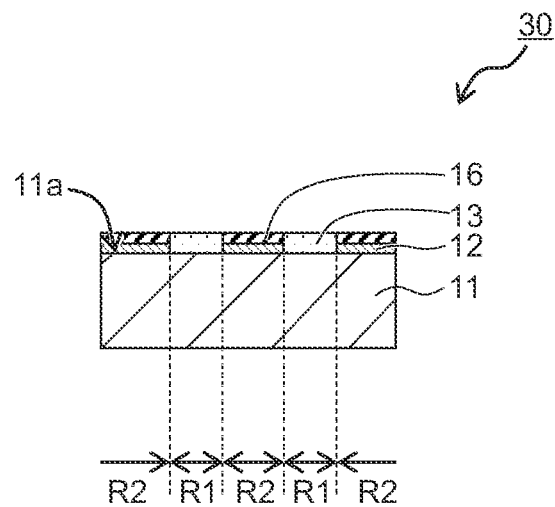
FIG. 5 is a drawing schematically illustrating a step of exposing the seed layer.

As shown in FIG. 5, the insulation layer 16 is etched so that the insulation layer 16 remains on the conductive layer 12 on the second region R2 and that the conductive layer 12 on the seed layer 13 is exposed, followed by removing the conductive layer 12 on the seed layer 13 to expose the surface of the seed layer 13. The conductive layer 12 on the seed layer 13 can be removed via etching. It should be understood that, when the conductive layer 12 is not formed on the seed layer 13 in the step of forming the conductive layer 12 (S3) and when the metal contained in the conductive layer 12 is completely alloyed with the metal contained in the seed layer 13 in the step of alloying (S4), it is not necessary to remove the conductive layer 12. In such a case, it is sufficient that the insulation layer 16 is etched so that the insulation layer 16 remains on the conductive layer 12 on the second region R2 and that the surface of the seed layer 13 or the surface of an alloy layer of the seed layer 13 and the conductive layer 12 is exposed.

As shown in FIG. 5, the entire insulation layer 16 may be etched without using a patterning technique. It should be understood that etching of the insulation layer 16 on the second region R2 is not indispensable, and that it is sufficient to etch the insulation layer 16 on at least the first region R1.

The insulation layer 16 and the conductive layer 12 may be subjected to either dry etching or wet etching. Examples of dry etching methods include reactive gas etching, sputter etching, plasma etching, ion milling, reactive ion etching (RIE), reactive ion beam etching, radical etching, photoexcited etching, laser-assisted etching, and laser ablation etching. A method of reactive ion etching can involve the use of capacitively coupled plasma (CCP), inductively coupled plasma (ICP), or microwave ECR (Electron Cyclotron Resonance) plasma. Examples of wet etching methods include chemical etching using an acid solution such as an HF solution or an alkaline solution as an etching solution and chemical mechanical polishing (CMP) performed via chemical etching in combination with mechanical polishing.

Etching gas or an etching solution used for etching of the insulation layer 16 and the conductive layer 12 may be appropriately selected depending on materials constituting the insulation layer 16 and the conductive layer 12. Examples of etching gas include $CF_4$, $SF_6$, boron, chlorine, HBr, and $BCl_3$. Examples of etching solutions that can be used include an acid solution such as an HF solution and an alkaline solution. When the insulation layer 16 is formed of $SiO_2$, SiOC, polysilane, or polysilazane, for example, the insulation layer 16 can be etched via reactive ion etching involving the use of $CF_4$ gas. When the insulation layer 16 is formed of $SiO_2$ or SiOC, the insulation layer 16 can be etched via wet etching using an HF solution. When the insulation layer 16 is formed of epoxy resin or acrylate resin, the insulation layer 16 can be etched via reactive ion etching using a gas mixture of $O_2/CF_4$ or a gas mixture of $O_2/SF_6/CHF_3$ or wet etching using an alkaline solution. When the conductive layer 12 is formed of silicide, the conductive layer 12 can be etched via reactive ion etching involving the use of $CF_4$ gas.

Accordingly, the second treated substrate 30 including the insulation substrate 11, the conductive seed layer 13 provided on the first region R1, the conductive layer 12 provided on the second region R2, and the insulation layer 16 provided on the conductive layer 12 can be obtained. In the second treated substrate 30, the height of the surface of the seed layer 13 from the main surface 11a of the insulation substrate 11 may be substantially equal to the height of the surface of the insulation layer 16 from the main surface 11a of the insulation substrate 11, which makes the surface of the second treated substrate 30 sufficiently flat. This facilitates uniform contact between the solid electrolyte membrane 52 and the second treated substrate 30 in the subsequent step of forming the metal layer (S7).

(7) Step of Forming Metal Layer (S7)

Figure 6:
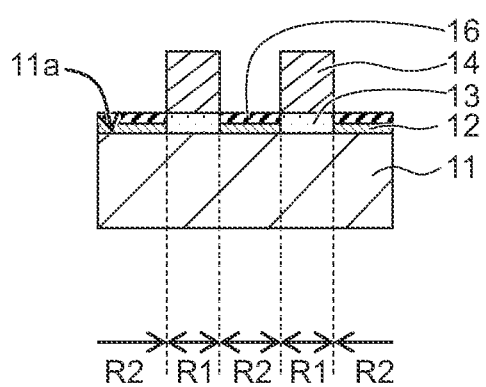
FIG. 6 is a drawing schematically illustrating a step of forming a metal layer.

As shown in FIG. 6, the metal layer 14 is formed on the surface of the seed layer 13. Examples of materials that can constitute the metal layer 14 include Cu, Ni, Ag, and Au. In some embodiments, the metal layer 14 may be formed of Cu. The metal layer 14 may have a thickness of, for example, 1 µm to 100 µm.

Figure 9:
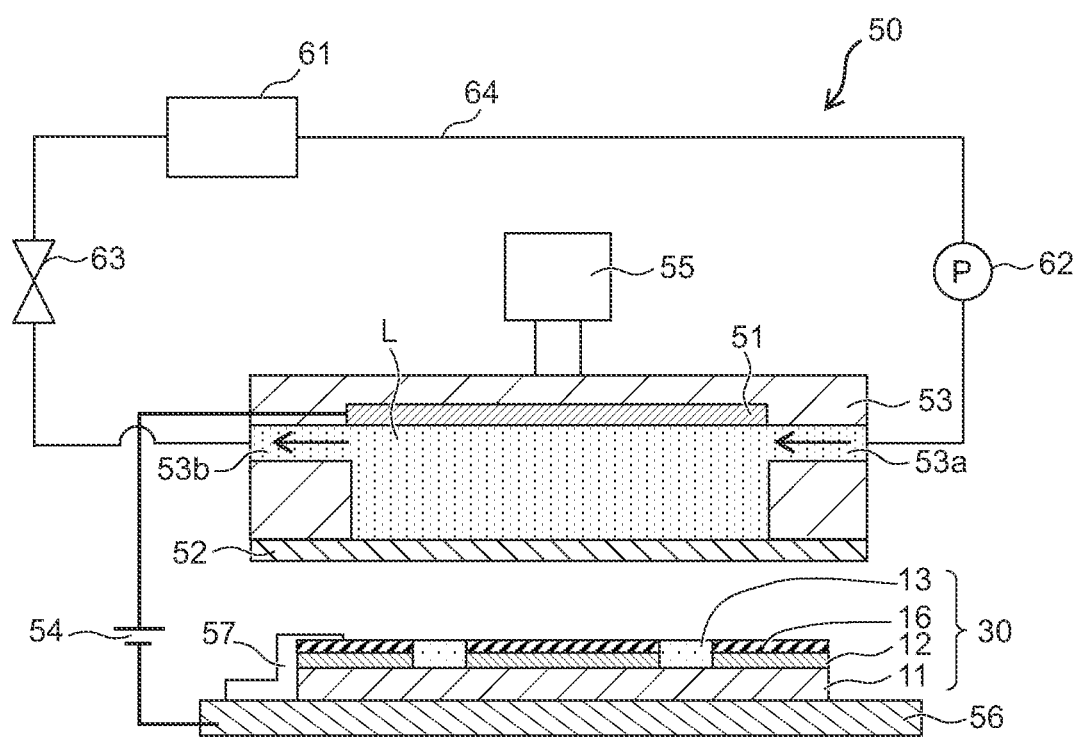
FIG. 9 is a cross-sectional view schematically illustrating a film-forming apparatus used in the step of forming the metal layer.
Figure 10:
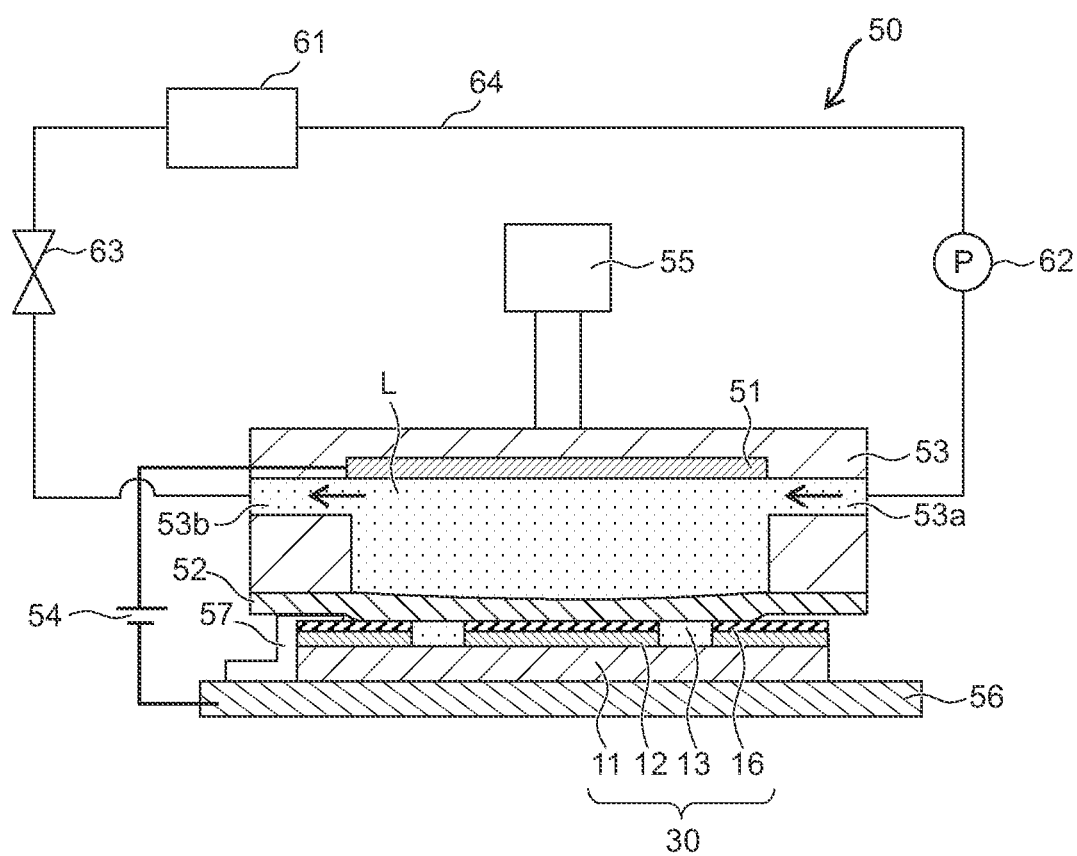
FIG. 10 is a cross-sectional view schematically illustrating the film-forming apparatus of FIG. 9 in which a housing is lowered to a predetermined level.

An example of a film-forming apparatus 50 used to form the metal layer 14 is shown in FIG. 9 and FIG. 10. The film-forming apparatus 50 includes a metal anode 51 provided to oppose the seed layer 13, a solid electrolyte membrane 52 provided between the anode 51 and the second treated substrate 30, and a power supply 54 that applies a voltage between the anode 51 and the seed layer 13.

The film-forming apparatus 50 further includes a housing 53. The housing 53 holds the anode 51 and a solution L containing ions of metal for constituting the metal layer 14 (hereafter, referred to as a "metal solution L") therein. As shown in FIG. 9, the housing 53 may define a space for accommodating the metal solution L between the anode 51 and the solid electrolyte membrane 52. In this case, the anode 51 may be a plate member formed of a material that is the same as the material constituting the metal layer 14 and soluble in the metal solution L (e.g., Cu) or a plate member formed of a material that is not soluble in the metal solution L (e.g., Ti). In the film-forming apparatus 50 having the space for accommodating the metal solution L between the anode 51 and the solid electrolyte membrane 52, the solid electrolyte membrane 52 can be pressed into contact with the second treated substrate 30 with a uniform pressing force. This allows the metal layer 14 to be uniformly formed on the seed layer 13 over the entire surface of the second treated substrate 30. Such film-forming apparatus 50 may be suitable for forming a fine wiring pattern.

The anode 51 may be in contact with the solid electrolyte membrane 52, although such configuration is not shown in the figures. In such a case, the anode 51 may be formed of a porous body through which the metal solution L can penetrate. The surface of the anode 51 opposite from the surface that is to be brought into contact with the solid electrolyte membrane 52 may be in contact with the space for accommodating the metal solution L.

Examples of materials that can constitute the solid electrolyte membrane 52 include cation-exchange resin such as fluorine resin (e.g. Nafion® from Du Pont), hydrocarbon resin, polyamic acid resin, or Selemion (CMV, CMD, and CMF series) from AGC. When the solid electrolyte membrane 52 is brought into contact with the metal solution L, the metal solution L is impregnated into the solid electrolyte membrane 52, which results in the solid electrolyte membrane 52 containing the metal solution L therein. The solid electrolyte membrane 52 may have a thickness of, for example, approximately 5 µm to approximately 200 µm.

The metal solution L contains metal which is a raw material of the metal layer 14 (e.g., Cu, Ni, Ag, or Au) in its ionic state. The metal solution L may contain nitrate ion, phosphate ion, succinate ion, sulfite ion, and/or pyrophosphate ion. The metal solution L may be an aqueous solution of metal salt, such as nitrate salt, phosphate salt, succinate salt, sulfate salt, or pyrophosphate salt.

In addition, the film-forming apparatus 50 includes a lifting and lowering device 55 that lifts or lowers the housing 53 on top of the housing 53. The lifting and lowering device 55 may include a hydraulic or pneumatic cylinder, a power-operated actuator, a linear guide, a motor, etc.

The housing 53 is provided with an inlet port 53a and an outlet port 53b. The inlet port 53a and the outlet port 53b are connected to a tank 61 by a piping 64. The metal solution L is transported from the tank 61 with the aid of a pump 62 connected to the piping 64, flows into the housing 53 through the inlet port 53a, discharged from the housing 53 through the outlet port 53b, and then returned to the tank 61. The piping 64 is provided with a pressure regulation valve 63 downstream of the outlet port 53b. With the aid of the pressure regulation valve 63 and the pump 62, a pressure of the metal solution L in the housing 53 can be regulated.

The film-forming apparatus 50 further includes a metal platform 56 on which the second treated substrate 30 is disposed and a conductive member 57 that electrically connects the metal platform 56 to the conductive layer 12 or the seed layer 13 of the second treated substrate 30. The conductive member 57 may be a metal plate that covers a part of the peripheral part of the second treated substrate 30 and is partially bent and brought into contact with the metal platform 56, thereby electrically connecting the metal platform 56 to the conductive layer 12 and the seed layer 13. The conductive member 57 may be attachable to and removable from the second treated substrate 30.

A negative electrode of the power supply 54 is electrically connected to the conductive layer 12 and the seed layer 13 through the metal platform 56, and a positive electrode of the power supply 54 is electrically connected to the anode 51.

The metal layer 14 can be formed using the film-forming apparatus 50 in the manner described below.

As shown in FIG. 9, the second treated substrate 30 and the conductive member 57 are disposed at predetermined positions on the metal platform 56. As shown in FIG. 10, subsequently, the housing 53 is lowered to a predetermined level with the aid of the lifting and lowering device 55.

Subsequently, the metal solution L is pressurized with the aid of the pump 62. The pressure regulation valve 63 allows the pressure of the metal solution L in the housing 53 to be maintained at a predetermined level. The solid electrolyte membrane 52 is deformed to fit and come into contact with the surface of the second treated substrate 30 (i.e., the surface of the seed layer 13 and the surface of the insulation layer 16), thereby bringing the metal solution L contained in the solid electrolyte membrane 52 into contact with the surface of the seed layer 13 and the surface of the insulation layer 16. The solid electrolyte membrane 52 is uniformly pressed against the surface of the seed layer 13 and the surface of the insulation layer 16 by the pressure of the metal solution L in the housing 53.

The power supply 54 applies a voltage between the anode 51 and the seed layer 13, thereby causing metal ions contained in the metal solution L in contact with the seed layer 13 to be reduced to metal on the surface of the seed layer 13 and the metal to be deposited on the surface of the seed layer 13. On the other hand, metal ions are not reduced and metals are not deposited on the surface of the insulation layer 16. Thus, the metal layer 14 is selectively formed on the surface of the seed layer 13. A voltage to be applied between the anode 51 and the seed layer 13 may be appropriately determined. Application of a higher voltage increases a metal deposition rate. In addition, the metal solution L may be heated, which also allows increase of the metal deposition rate.

After the metal layer 14 having a given thickness is formed, voltage application between the anode 51 and the seed layer 13 is terminated, and pressurization of the metal solution L by the pump 62 is terminated. The housing 53 is then lifted to a predetermined level (see FIG. 9) to separate the solid electrolyte membrane 52 from the metal layer 14. The second treated substrate 30 with the metal layer 14 formed thereon is then removed from the metal platform 56.

(8) Step of Removing Insulation Layer and Conductive Layer (S8)

Figure 7:
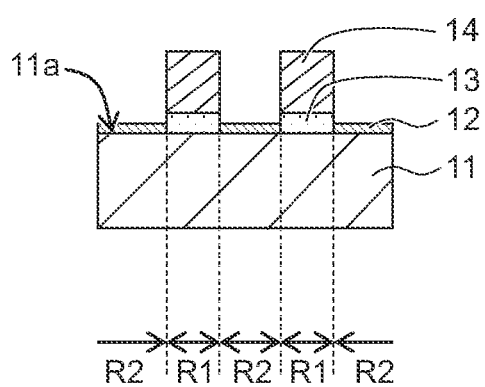
FIG. 7 is a drawing schematically illustrating a step of removing the insulation layer and the conductive layer.
Figure 8:
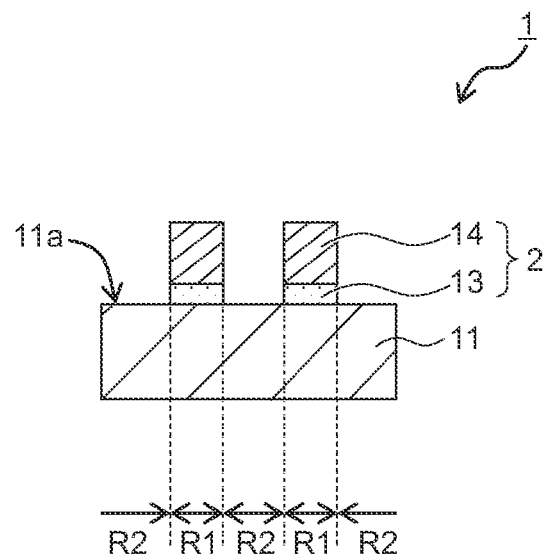
FIG. 8 is a drawing schematically illustrating the step of removing the insulation layer and the conductive layer.

The insulation layer 16 is removed as shown in FIG. 7, and the conductive layer 12 is then removed as shown in FIG. 8. Thus, a wiring layer 2 including the seed layer 13 and the metal layer 14 and having the predetermined wiring pattern is formed on the insulation substrate 11.

The insulation layer 16 and the conductive layer 12 can be removed via etching. The insulation layer 16 and the conductive layer 12 may be etched via either dry etching or wet etching. Examples of dry etching methods include reactive gas etching, sputter etching, plasma etching, ion milling, reactive ion etching (RIE), reactive ion beam etching, radical etching, photo-excited etching, laser-assisted etching, and laser ablation etching. A method of reactive ion etching can involve the use of capacitively coupled plasma (CCP), inductively coupled plasma (ICP), or microwave ECR (Electron Cyclotron Resonance) plasma.

Etching gas or an etching solution used for etching of each of the insulation layer 16 and the conductive layer 12 may be appropriately selected depending on a material constituting each of the insulation layer 16 and the conductive layer 12. Examples of etching gas include $CF_4$, $SF_6$, boron, chlorine, HBr, and $BCl_3$. Examples of etching solutions that can be used include an acid solution such as air HF solution and an alkaline solution. When the insulation layer 16 is formed of $SiO_2$, SiOC, polysilane, or polysilazane, for example, the insulation layer 16 can be etched via reactive ion etching involving the use of $CF_4$ gas. When the insulation layer 16 is formed of $SiO_2$ or SiOC, the insulation layer 16 can be etched via wet etching using an HF solution. When the insulation layer 16 is formed of epoxy resin or acrylate resin, the insulation layer 16 can be etched via reactive ion etching using a gas mixture of $O_2/CF_4$ or a gas mixture of $O_2/SF_6/CHF_3$ or wet etching using an alkaline solution. When the conductive layer 12 is formed of silicide, the conductive layer 12 can be etched via reactive ion etching involving the use of $CF_4$ gas.

As a result of the process described above, the wiring substrate 1 including the insulation substrate 11 and the wiring layer 2 having the predetermined wiring pattern provided on the insulation substrate 11 is produced.

In the present embodiment, as described above, the insulation layer 16 formed on the conductive layer 12 on the second region R2 allows selective deposition of metal on the surface of the seed layer 13 in the step of forming the metal layer 14 (S7). In other words, the insulation layer 16 allows avoiding or reducing metal deposition in a region other than the predetermined wiring pattern.

According to an intensive examination by the inventors, without the insulation layer 16 formed on the conductive layer 12 on the second region R2, metals may be disadvantageously deposited on the conductive layer 12 upon applying a higher voltage or heating the metal solution L in the step of forming the metal layer 14 (S7). In the production method according to the present embodiment, however, the insulation layer 16 formed on the conductive layer 12 can prevent or reduce such unintended metal deposition. This allows applying a high voltage and/or heating the metal solution L in the step of forming the metal layer 14 (S7), thereby increasing the metal deposition rate and shortening the duration of production of the wiring substrate 1.

In the production method according to the present embodiment, the wiring substrate 1 can be produced without the use of a resist mask. This allows reduction of the cost for production and shortening of the duration of production of the wiring substrate 1.

The embodiments of the present disclosure are described in detail above. It should be noted that the present disclosure is not limited to the embodiments described above and that various design modifications may be made without departing from the spirit and scope of the present disclosure described in the claims.

EXAMPLES

Hereafter, the present disclosure is specifically described with the examples, but the present disclosure is not limited to these examples.

Example 1

A glass epoxy substrate (a glass fiber-reinforced epoxy laminate) was prepared as an insulation substrate. On the main surface of the insulation substrate, an Ag layer having a predetermined pattern was formed as a seed layer using an ink containing silver nanoparticles. Thus, a seeded substrate was obtained.

In order to sinter the seed layer and enhance the adhesion between the seed layer and the insulation substrate, the seeded substrate was heated by irradiation of the surface of the seeded substrate with a laser beam (wavelength: 1,064 nm; beam diameter: 1.6 mm; output: 150 W) for 0.2 seconds in an inert atmosphere.

Subsequently, a 300-nm-thick Ti layer was formed as a conductive layer on the seeded substrate via sputtering. The conductive layer was formed on the entire main surface of the seeded substrate. That is, the seed layer and a region, which was not coated with the seed layer, of the main surface of the insulation substrate were coated with the conductive layer. Thus, a first treated substrate was obtained.

An $SiO_2$ layer was formed on the first treated substrate by the CVD method to form an insulation layer coating the seed layer and the conductive layer.

The entire insulation layer was etched via ion milling to expose the conductive layer on the seed layer. The conductive layer on the seed layer was then removed via ion milling. Thus, the surface of the seed layer was exposed. The conductive layer and the insulation layer were remained on the region, which was not coated with the seed layer, of the main surface of the insulation substrate, and the surface of the conductive layer and the surface of the insulation substrate were not exposed.

With the use of the film-forming apparatus 50 shown in FIG. 9 and FIG. 10, a Cu layer was formed as a metal layer on the surface of the seed layer under the conditions described below.

Cathode: seed layer

Anode: oxygen-free copper wire

Solid electrolyte membrane: Nafion® (thickness: approximately 8 μm)

Metal solution: 1.0 mol/l of copper sulfate aqueous solution

Pressure for pressing the solid electrolyte membrane against the seed layer: 1.0 MPa Voltage applied: 0.5 V Current density: 0.23 mA/cm$^2$ Subsequently, the remaining insulation layer and conductive layer were removed via capacitively coupled plasma etching using $CF_4$ gas. Thus, a wiring layer having a predetermined wiring pattern and consisting of the seed layer and the metal layer was formed on the insulation substrate. A wiring substrate including the insulation substrate and the wiring layer was thus obtained.

Example 2

A wiring substrate was prepared in the same manner as in Example 1, except that a glass substrate was used as the insulation substrate and the surface of the seeded substrate was irradiated with the laser beam of 180 W.

Example 3

A wiring substrate was prepared in the same manner as in Example 1, except that polyimide was applied as a primer to the main surface of the insulation substrate via spin coating before formation of the seed layer and that the seeded substrate was heated at 120° C. for 30 minutes in an inert atmosphere instead of performing the laser irradiation.

Example 4

A wiring substrate was prepared in the same manner as in Example 2, except that polyimide was applied as a primer to the main surface of the insulation substrate via spin coating before the seed layer was formed.

Example 5

A wiring substrate was prepared in the same manner as in Example 1, except that the main surface of the insulation substrate was roughened before forming the seed layer and that the seeded substrate was heated at 120° C. for 30 minutes in an inert atmosphere instead of performing the laser irradiation.

Comparative Example 1

A glass epoxy substrate was prepared as an insulation substrate. On the entire main surface of the insulation substrate, a 100-nm-thick $WSi_2$ layer was formed as a conductive layer via sputtering.

Subsequently, an Ag layer having a predetermined pattern was formed as a seed layer on the conductive layer with the use of an ink containing silver nanoparticles.

A Cu layer was formed as a metal layer on the surface of the seed layer using the film-forming apparatus 50 shown in FIGS. 9 and 10 under the same conditions as in Example 1.

Subsequently, the conductive layer was subjected to capacitively coupled plasma etching using $CF_4$ gas with the metal layer serving as a mask. Thus, a wiring layer having a predetermined wiring pattern and consisting of the remaining conductive layer, the seed layer, and the metal layer was formed on the insulation substrate. A wiring substrate including the insulation substrate and the wiring layer was thus obtained.

Comparative Example 2

A wiring substrate was prepared in the same manner as in Comparative Example 1, except that the substrate was heated at 200° C. for 30 minutes in an inert atmosphere after the conductive layer was formed and before the seed layer was formed.

<Evaluation of Adhesion>

The wiring substrates prepared in Examples 1 to 5 and Comparative Examples 1 and 2 were subjected to tape peel tests. The wiring layers of the wiring substrates of Comparative Examples 1 and 2 were peeled from the insulation substrates. The wiring layers of the wiring substrates of Examples 1 to 5 were not peeled from the insulation substrates. The results indicated that the wiring substrates of Examples 1 to 5 exhibit adhesion between the wiring layer and the insulation substrate better than those of the wiring substrates of Comparative Examples 1 and 2.

Example 6

A glass substrate was prepared as an insulation substrate. A 300-nm-thick Cu layer with a predetermined pattern was formed as a seed layer on the main surface of the insulation substrate via screen printing with the use of an ink containing copper nanoparticles. Thus, a seeded substrate was obtained In order to sinter the seed layer and enhance the adhesion between the seed layer and the insulation substrate, the seeded substrate was heated by irradiation of the surface of the seeded substrate with a laser beam (wavelength: 1,064 nm; beam diameter: 1.6 mm; output: 180 W) for 1 second in an inert atmosphere.

Subsequently, a 300-nm-thick $WSi_2$ layer was formed as a conductive layer on the seeded substrate via sputtering. The conductive layer was formed on the entire main surface of the seeded substrate. That is, the seed layer and a region, which was not coated with the seed layer, of the main surface of the insulation substrate were coated with the conductive layer. Thus, a first treated substrate was obtained.

Polysilazane was applied on the first treated substrate via mist coating to form an insulation layer coating the seed layer and the conductive layer.

The entire insulation layer was etched via ion milling to expose the conductive layer on the seed layer. The conductive layer on the seed layer was then removed via ion milling. Thus, the surface of the seed layer was exposed. The conductive layer and the insulation layer were remained on the region, which was not coated with the seed layer, of the main surface of the insulation substrate, and the surface of the conductive layer and the surface of the insulation substrate were not exposed.

With the use of the film-forming apparatus 50 shown in FIG. 9 and FIG. 10, a Cu layer was formed as a metal layer on the surface of the seed layer under the conditions described below.

Cathode: seed layer
Anode: oxygen-free copper wire
Solid electrolyte membrane: Nafion® (thickness: approximately 8 μm)
Metal solution: 1.0 mol/l of copper sulfate aqueous solution
Pressure for pressing the solid electrolyte membrane against the seed layer: 1.0 MPa
Voltage applied: 0.5 V
Current density: 0.23 $mA/cm^2$ Subsequently, the remaining insulation layer and conductive layer were removed via capacitively coupled plasma etching using $CF_4$ gas. Thus, a wiring layer having a predetermined wiring pattern and consisting of the seed layer and the metal layer was formed on the insulation substrate. A wiring substrate including the insulation substrate and the wiring layer was thus obtained.

Example 7

A wiring substrate was prepared in the same manner as in Example 6, except that epoxy acrylate was applied on the first treated substrate via dip coating to form an insulation layer coating the seed layer and the conductive layer and that the remaining insulation layer was removed via capacitively coupled plasma etching using a gas mixture of $O_2/CF_4$.

Example 8

A wiring substrate was prepared in the same manner as in Example 6, except that $SiO_2$ was deposited on the first treated substrate by the CVD method to form an insulation layer coating the seed layer and the conductive layer.

Example 9

A wiring substrate was prepared in the same manner as in Example 6, except that $SiO_2$ was deposited on the first treated substrate via sputtering to form an insulation layer coating the seed layer and the conductive layer.

Comparative Example 3

A wiring substrate was prepared in the same manner as in Example 6, except that the insulation layer was not formed and etching of the insulation layer was not performed.

<Evaluation of Controllability of Metal Deposition Site>

The wiring substrate of Comparative Example 3 was observed under a microscope (magnification: 100×). Deposition of Cu was observed in a region other than the region corresponding to the wiring pattern. Specifically, a Cu layer that was not included in the wiring layer was observed. On the basis of the microscopic image, a proportion of an area of the Cu layer that was not included in the wiring layer to the area of the region other than the region corresponding to the wiring pattern was calculated using an image analysis software "WinROOF", resulting in 1%.

The wiring substrates of Examples 6 to 9 were observed under a microscope in the same manner. Deposition of Cu was not observed in a region other than the region corresponding to the wiring pattern.

What is claimed is:

1. A method for producing a wiring substrate comprising an insulation substrate and a wiring layer having a predetermined wiring pattern and provided on the insulation substrate, the method comprising the steps of:
    (a) preparing a seeded substrate comprising:
        the insulation substrate having a main surface composed of a first region having a predetermined pattern corresponding to the wiring pattern and a second region other than the first region; and
        a conductive seed layer provided on the first region;
    (b) forming a conductive layer at least on the second region to obtain a first treated substrate;
    (c) forming an insulation layer on the first treated substrate to coat the seed layer and the conductive layer with the insulation layer;
    (d) exposing the seed layer by etching the insulation layer while leaving the insulation layer on the conductive layer on the second region to obtain a second treated substrate, the etching comprising removing a portion of the insulation layer that is on the seed layer such that a top surface of the seed layer becomes exposed between portions of the insulation layer on the second region, wherein the exposing the seed layer is performed such that the top surface of the seed layer is at a same height, from the main surface of the insulation substrate, as a top surface of the insulation layer;
    (e) forming a metal layer on the surface of the seed layer wherein a voltage is applied between an anode and the seed layer while a solid electrolyte membrane containing a metal ion-containing solution being disposed between the second treated substrate and the anode, and the solid electrolyte membrane and the seed layer being pressed into contact with each other; and
    (f) removing the insulation layer and the conductive layer.

2. The method according to claim 1, further comprising, after the step (a) and before the step (e), the step of:
    (g) enhancing adhesion between the insulation substrate and the seed layer.

3. The method according to claim 2, wherein the step (g) is performed before the step (b).

4. The method according to claim 1, wherein, in the step (b), the conductive layer is formed on the second region and on the seed layer.

5. The method according to claim 1, wherein the seed layer and the conductive layer each contain a metal, and the metal contained in the conductive layer has a standard oxidation-reduction potential lower than that of the metal contained in the seed layer.

6. The method according to claim 1, wherein the seed layer and the conductive layer each contain a metal, and the method further comprises, after the step (b) and before the step (e), the step of:
    (h) alloying the metal contained in the seed layer with the metal contained in the conductive layer.

* * * * *